US006810515B2

(12) United States Patent
Lu et al.

(10) Patent No.: US 6,810,515 B2
(45) Date of Patent: Oct. 26, 2004

(54) PROCESS OF RESTRUCTURING LOGICS IN ICS FOR SETUP AND HOLD TIME OPTIMIZATION

(75) Inventors: Aiguo Lu, Cupertino, CA (US); Ivan Pavisic, San Jose, CA (US); Andrej A. Zolotykh, Fryazino, Moskovskaya Oblast (RU); Elyar E. Gasanov, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 162 days.

(21) Appl. No.: 10/254,380

(22) Filed: Sep. 25, 2002

(65) Prior Publication Data

US 2004/0060012 A1 Mar. 25, 2004

(51) Int. Cl.[7] ............................ G06F 17/50; G06F 9/45
(52) U.S. Cl. .................................. 716/18; 716/2; 716/6
(58) Field of Search ......................... 716/1–2, 6, 16–18

(56) References Cited

U.S. PATENT DOCUMENTS 5,649,176 A * 7/1997 Selvidge et al. .............. 716/16
6,173,435 B1 * 1/2001 Dupenloup .................. 716/18
6,564,361 B1 * 5/2003 Zolotykh et al. .............. 716/8
6,681,377 B2 * 1/2004 Beletsky ........................ 716/6

* cited by examiner

*Primary Examiner*—Vuthe Siek
*Assistant Examiner*—Paul Dinh
(74) *Attorney, Agent, or Firm*—Westman, Champlin & Kelly

(57) ABSTRACT

A process of optimizing setup and hold time violations comprising resynthesis of data and clock logics coupled to pins of the integrated circuit to optimize setup time violations, and resynthesizing data and clock logics coupled to pins of the integrated circuit to optimize hold time violations. Optimization of setup time violations is performed by resynthesis of the clock logics of each pin having a setup time violation to optimize the setup time violations, then resynthesis of the data logics of each pin having a setup time violation to optimize the setup time violations, and then resynthesis of the clock logics of each pin having a setup time violation to optimize the setup time violations. The hold time violations are then optimized by resynthesizing the data logics to optimize the hold time violations, and then resynthesizing the clock logics to optimize the hold time violations. Cost functions are calculated for each pin based on setup and hold time violations, and are selectively applied to the resynthesis steps.

18 Claims, 2 Drawing Sheets

202 Input
step 200 Optimize maximal setup time violation using data logics
204 optimized ? yes / no
no more violation ? 206 yes / no
step 210 212 Partially optimize setup time violation using clock logics without hold time control
214 optimized ? yes / no
step 220 222 Optimize setup time violation using clock logics with hold time control
224 optimized ? / no more violation ? 226
step 230 232 Optimize setup time violation using data logics
234 optimized ? / no more violation ? 236
step 240 242 Optimize setup time violation using clock logics
244 optimized ? / no more violation ? 246
step 250 252 Optimize hold time violation using data logics
254 optimized ? / no more violation ? 256
step 260 262 Optimize hold time violation using clock logics with setup time control
264 optimized ? / no more violation ? 266
End 268

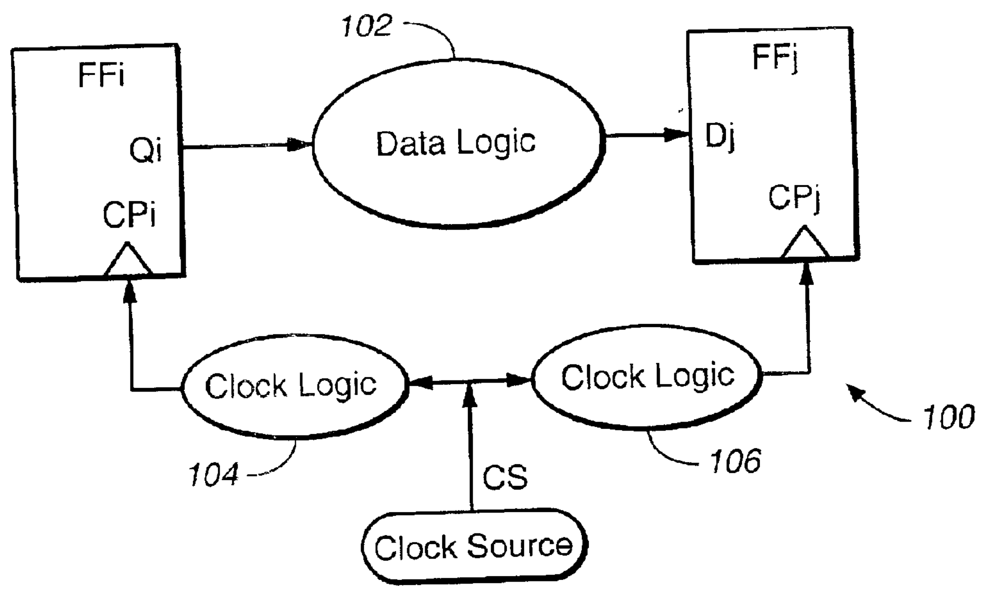
FIG._1
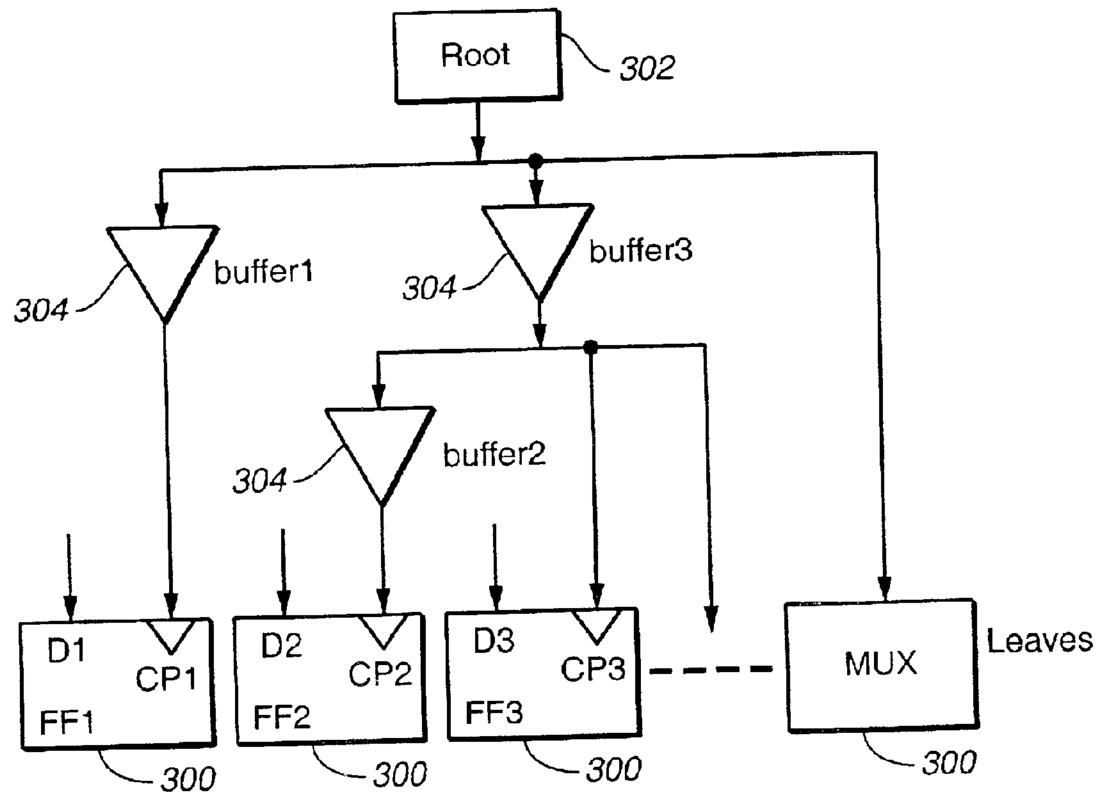
FIG._3

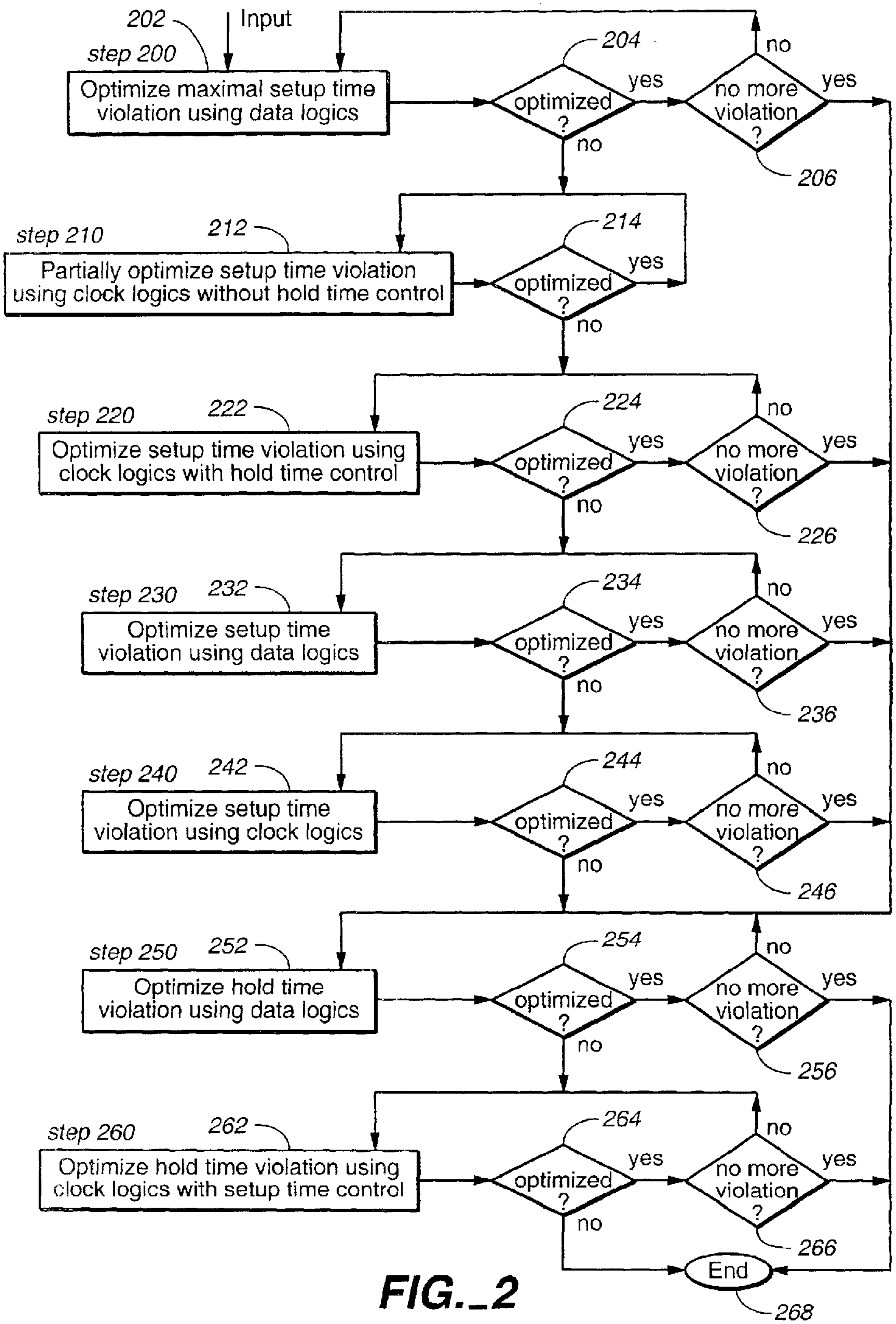
FIG._2

PROCESS OF RESTRUCTURING LOGICS IN ICS FOR SETUP AND HOLD TIME OPTIMIZATION

FIELD OF THE INVENTION

This invention relates to design techniques for designing ICs and particularly to optimization of setup time and hold time in ICs by restructuring the data and clock logics for timing optimization.

BACKGROUND OF THE INVENTION

An integrated circuit chip (herein referred to as an "IC" or "chip") comprises cells and connections between cells supported by a substrate. A cell is a group of one or more circuit elements, such as transistors, capacitors and other basic circuit elements, grouped to perform a function. Each cell may have one or more pins, which in turn may be connected to one or more pins of other cells by wires. A net comprises circuitry coupling two or more pins. A typical IC includes a large number of cells and requires complex wire connections between the cells. A typical chip has thousands, tens of thousands and even hundreds of thousands of pins which are connected in various combinations.

The IC components are fabricated on a substrate or wafer by layering different materials. The design of an IC transforms a circuit description into a geometric description known as a layout. Due to the large number of components and exacting details required by fabrication processes, the layout of an IC is ordinarily designed using a computer. The performance of an IC is computed during the design process using computed delays of the cells, including the setup and hold time delays. The setup time is the time duration that a data signal is required to be available at the input of a cell before the clock signal transition. The hold time is the time duration that a data signal is required to be stable after the clock signal transition. Delay of either of these events can affect IC performance.

In the design of integrated circuits, it has become increasingly accepted that more useful skews and higher IC operating frequencies may be realized by simultaneous optimization of the clock logics and the data logics. For example, see U.S. application Ser. No. 09/885,589 filed Jun. 19, 2001 for "Method of Integrating Clock Tree Synthesis and Timing Optimization for an Integrated Circuit Design" by Pavisic et al. and U.S. application Ser. No. 09/991,574 filed Nov. 20, 2001 for "Changing Clock Delays in an Integrated Circuit for Skew Optimization" by Lu et al., both assigned to the same assignee as the present invention. Not only does this approach provide an additional optimization potential, but it also greatly simplifies the design flow. However there is a potential problem with this approach. More particularly, simultaneous optimization of clock logics and data logics may increase the hold time violations when optimizing setup time.

One technique to resolve timing violation problems is addressed in a synthesis tool described in U.S. application Ser. No. 09/677,475 filed Oct. 2, 2000 for "Method and Apparatus for Timing Driven Resynthesis" by Zolotykh et al. and assigned to the same assignee as the present invention. While the Zolotykh et al. technique has been quite successful, there nevertheless exists a risk that hold time violations can be increased. There is, therefore, a need for a cost-effective technique to optimize the setup time without significantly increasing the hold time violations.

SUMMARY OF THE INVENTION

The present invention is directed to a technique permitting trade off of the priorities of both setup and hold time optimization targets while minimizing the cost function at each optimization step.

In accordance with one embodiment of the present invention, setup and hold time violations are optimized by resynthesizing data and clock logics coupled to pins of the integrated circuit to optimize setup time violations, and resynthesizing the data and clock logics coupled to pins of the integrated circuit to optimize hold time violations.

More particularly, setup time violations are optimized by resynthesizing the clock logics of each pin having a setup time violation. The data logics are then resynthesized for each pin having a setup time violation. The clock logics are then again resynthesized for each pin having a setup time violation.

In preferred embodiments, the first step of resynthesis of the clock logics to optimize setup time violations is performed by resynthesizing the data logics of pins having a maximal setup time violation to optimize the maximal setup time violation. The clock logics are resynthesized for first and second groups of pins to optimize the setup time violation of each pin of the first group without controlling the hold time, and to optimize the setup time violation of each pin of the second group while controlling the hold time.

Preferably, the hold time violations are optimized by resynthesizing the data logics of each pin having a hold time violation. The clock logics are then resynthesized for each pin having a hold time violation.

In preferred embodiments, a plurality of cost functions are calculated based on setup and hold time violations, are selectively applied to the resynthesis processes.

In other embodiments, the process is carried out using a computer operating under the control of program code.

BRIEF DESCRIPTION OF THE DRAWINGS

FIG. 1 is portion of an IC chip to which the present invention may be applied.

FIG. 2 is a flowchart illustrating the process of optimization of setup and hold times according to an embodiment of the present invention.

FIG. 3 is a diagram of a clock tree useful in explaining certain aspects of the invention.

DETAILED DESCRIPTION OF THE PREFERRED EMBODIMENTS

FIG. 1 illustrates a portion of a typical IC 100 containing flip-flops FFi and FFj, a cluster of data logics 102 from pin Qi to pin Dj and clusters of clock logics 104 and 106 from the clock source pin CS to clock pins CPi and CPj.

In the timing analysis of a design, different delay characteristics of gates and wires are used depending on the environment where the chip will be used (e.g., temperature, voltage, and the usage of chip). The worst case delay and best case delay are two extreme conditions which are often used to calculate the setup time violations and the hold time violations of a design.

The following notations will be used in the present description:

$D|_{ij}^{W}$ is the worst case maximal delay from CPi to Dj.

$D|_{y}^{b}$ is the best case minimal delay from CPi to Dj.

$CD|_{i}^{W}$ and $CD|_{j}^{W}$ are the worst case maximal delays from clock source pin CS to CPi and CPj, respectively.

$CD|_{i}^{b}$ and $CD|_{j}^{b}$ are the best case minimal delays from CS to CPi and CPj, respectively.

T is the clock period of the design (if the chip operates at 200 MHz frequency, T=1/(200 MHz), or 5 nanoseconds (5 ns).

Setupj and Holdj are the setup time and hold time margins, respectively, for gate FFj, and are given in the implementation technology library.

Coef is the margin to ensure that chip will operate properly during the design flow.

SSi is the setup time slack at CPi, and is defined as $$SSi=T-(Setupj+Coef+CD|_i^W+D|_{ij}^W-CD|_j^W). \quad (1)$$

HSi is the hold time slack at CPi, and is $$\text{defined as } HSi=CD|_i^b+D|_{ij}^b-CD|_j^b-Holdj-Coef. \quad (2)$$

If SSi<0, there is a setup time violation at clock pin CPi. In the zero clock skew mode, which means $CD|_i^W=CD|_j^W$, Equation (1) can be represented as $$SSi=T-(Setupj+Coef+D|_{ij}^W). \quad (3)$$

From Equation (3), it is clear that the setup time violation means that the data signal reaches pin Qj too late in the worst case delay mode (in other words, delay $D|_{ij}^W$ is too big), with reference to the clock period T.

Similarly if HSi<0, there is a hold time violation at clock pin CPi. The hold time violation means that the data signal reaches pin Qj too early in the best case delay mode.

When the clock logic is optimized to provide useful skews to fix the setup time violation, the clock logic can be restructured so that the clock signal reaches CPi early (reduce $CD|_i^W$) or so that the clock signal reaches CPj late (increasing $CD|_j^W$), or both. In this way, SSj can be made positive, thus removing the setup time violation. However, reducing $CD|_i^W$ will correspondingly reduce $CD|_i^b$, and increasing $CD|_j^W$ will increase $CD|_j^b$. Reducing $CD|_i^b$ and increasing $CD|_j^b$ will tend to make HSj negative, causing a hold time violation. The present invention allows simultaneous optimization of both setup and hold times.

The setup time slack at data pin Qj is equal to SSi, and the hold time slack at Qj is equal to HSj. The present invention includes calculation of the setup time violations and hold time violations on both clock pin and data pin of an element. If a pin has a setup time slack of −2 ns, the pin has a 2 ns setup time violation; if a pin has a hold time slack of −0.3 ns, the pin has a 0.3 ns hold time violation.

FIG. 2 is a flowchart illustrating the procedure which is used to correct both setup and hold time violations. The control flow itself is intuitive. The process is performed in seven iterative steps Step 200, shown at blocks 202, 204 and 206, starts at step 202 where a gate pin having a maximal setup time violation is selected. The purpose of step 200 is to define a smallest initial maximal setup time violation. At step 200, the data logics (either gates or wires) connected to this pin are optimized to reduce $D|_{ij}^W$ in Equation (1) such that the maximal setup time violation is reduced. Step 200 is repeated in an iterative process to reduce setup time violations each iteration. For example, if the original maximal setup time violation is 6 nanoseconds, optimizing the data logics connected to the pin may reduce the maximal setup time violation to 5.95 ns. Then, data logics with 5.95 ns setup time violation are optimized. This process continues until the maximal setup time violation cannot be further reduced.

At block 202, the maximal setup time violations are optimized. More particularly, the data logics for a pin having the maximum setup time violation are resynthesized to reduce the setup time violation for that pin. In the above example, the data logics associated with a pin having a maximum setup time violation of 6.0 ns are resynthesized to reduce the setup time violation to 5.95 ns. Any overlap generated by the resynthesis process is then removed. After resynthesis of the data logics associated with the pin is completed, as determined at block 204, if any other pins have a maximal setup time violation, at block 206 the process loops back to block 202 to resynthesize the data logics associated with another pin now having a maximal setup time violation. The next pin selected, therefore, is a pin with a maximal setup time violation greater than the new setup time of the logic circuits associated with the pin already considered, or greater than 5.95 ns, in the example. In either case, step 200 iterates through blocks 202–206 until either it can optimize the maximal setup time violation no further (block 204) (that is, no further pins have a maximal setup time violation greater than a pin already considered) , or the design is optimized and there are no setup time violations (block 206). If the maximal setup time cannot be reduced further, as at block 204, the process continues to block 212 of step 210. If there are no more setup time violations, as at block 206, the process continues to block 252 of step 250.

Logic circuit resynthesis at block 202 may be any convenient resynthesis process that reduces setup time of the logic circuits associated with a pin. One particularly good resynthesis process is described in the aforementioned Zolotykh application, which is incorporated herein by reference.

While step 200 is described as being performed first, the optimization steps may be in any convenient order and the order described herein is not limiting on the scope of the invention. We prefer that step 200 be the first step because the data logic optimization has much less negative effects on the hold time when compared with the clock logic optimization.

At step 210, consisting of blocks 212 and 214, the setup time for pins with large setup time violations are optimized using the clock logics without consideration of a hold time control. Consider a maximal setup time violation at the beginning of step 210 is Vm. All clock pins whose setup time violation is larger than Vm/2 are candidates for optimization at this step. In step 210, the clock network connected to these candidate clock pins are restructured to reduce the setup time violations. Because step 210 operates on paths with large setup time violations, hold time is not considered so that there will be a greater chance to fix these large setup time violations by optimizing the clock network.

At block 212, the setup time violations are optimized using the cost functions described below. This step is similar to that performed at block 202, except that the hold time control is not considered. The clock logics are resynthesized for each pin having a setup time violation that is greater than one-half the maximal setup time violation found in step 200 to reduce the setup time violation. In the above example, the data logics associated with each pin having a setup time violation of 2.975 ns (5.95 ns/2) is resynthesized. At block 214, after the logic circuits for a pin are resynthesised, the process loops back to block 212 for the next pin. Upon completion of resynthesis of the logic circuits for all pins with a setup time violation greater than Vm/2 m the process continues to block 222 of step 220.

At step 220, consisting of blocks 222, 224 and 226, setup times are optimized for pins whose setup time violations are less than or equal to Vm/2. Considering that the data logic optimization steps 200 and 230 (which follows) may be able to fix these setup time violations, the hold time violation on these clock pins are controlled and the setup times are optimized using the cost functions described below. Here, the intent is to fix the setup time violation without deteriorating the hold time violation. For example, consider a clock pin having a setup time violation 0.5 ns and hold time violation 0.1 ns. Assume further there are two solutions in restructuring this part of the clock network, one which would reduce the setup time violation to 0.3 ns but increase the hold time violation to 0.2 ns, and the other would reduce the setup time violation to 0.45 ns without affecting the hold time violation. Step 220 will select the second solution without affecting the hold time violation.

At block 222, the setup times are optimized by resynthesis of the clock logics while controlling the hold time, and using the cost functions described below. More particularly, the clock logics for pins with setup time violations are resynthesized to reduce the setup time. After resynthesis of the clock logics, as determined at block 224, if any other pins have setup time violations, at block 226 the process loops back to block 222 to resynthesize the clock logics associated with another pin having a setup time violation. Step 220 iterates through blocks 222–226 until either it removes setup time violations (block 226), or it can optimize the setup times no further (block 224). If setup time violations still exist, as at block 224, the process continues to block 232 of step 230. If the setup time optimization is completed, as at block 226, the process continues to block 252 of step 250.

Step 230, consisting of block 232, 234 and 236, is substantially the same as step 200. A resynthesis process, such as the Zolotykh process, is applied to all data logics connected to pins with setup time violations. If setup time violations still remain after block 232, then the process continues to step 240. If no setup time violations remain after completing step 230, the process continues to block 252 of step 250.

If setup time violations still remain after completing step 230, then at step 240, consisting of blocks 242, 244 and 246, the clock logics are optimized again, as in step 220. This is performed because the optimizations performed in step 230 may provide the chance to fix those setup time violations which could not be done in step 220. For example, if a flip-flop has a setup time violation of 0.3 ns at its clock pin and 0.2 ns at its data pin, restructuring the clock logic might make the clock signal reach the clock pin 0.15 ns earlier. If that occurs, the setup time violation of clock pin could be reduced to 0.3−0.15=0.15 ns. However, the data pin violation might be increased to 0.2+0.15=0.35 ns, which increases the setup time violation. Consequently, it is not possible to restructure the clock logic for optimization. However, if the data logic delay to this flip-flop's data pin is reduced in step 230, room will be provided for this 0.15 ns reduction in step 240.

Thus at block 242, setup times are optimized by resynthesis of the clock logics, similar to block 222 of step 220, but without controlling the hold time. Upon completion of the optimization of the setup time at steps 210–240, the process continues to step 250 to optimize the hold time.

At step 250, consisting of blocks 252, 254 and 256, the data logics are optimized using the aforementioned process described in step 200 to reduce hold time violations.

If there is still a hold time violation after step 250, then at step 260 (blocks 262, 264 and 266) the clock logics are restructured, using the cost functions described below, to correct the hold time. As shown in Equation (2), the hold time violation can be reduced by increasing $CD|_i^b$ or reducing $CD|_j^b$, or both. To make the application of the process converge, the setup time violation is controlled so that step 250 will not increase the setup time violation.

The process ends at block 268 with a design having optimal setup and hold times.

The cost functions are a key factor used to manage the clock logic optimization. The clock logic to be optimized is a buffer tree, shown in FIG. 3, whose root 302 can be any cell in the clock network and whose leaves 300 are either sequential cells (e.g., flip-flop and memory) or the combinational logics in the clock network. The cells 304 inside the tree can only be buffer and inverter cells.

For each leaf cell 300, which may be a flip-flop or combinational logic like a multiplexer (MUX) shown in FIG. 3, the setup time violations and hold time violations are calculated for the leaf cell's clock pin (e.g., CP1) and for its data pin (e.g., D1). Consequently, there will be four violation values for each leaf cell. If there are N leaf cells in the clock tree to be optimized, the four violation values for each leaf cell can be represented in a two-dimensional array. The four violation values are denoted as V[i][j], where i represents the ith leaf (i.e., $i \subseteq \{1, \ldots N\}$), and j represents one of 4 violation values (i.e., $j \subseteq \{1,2,3,4\}$). Thus, V[i][1] represents the setup time violation at ith leaf's clock pin;

V[i][2] represents the setup time violation at ith leaf's data pin;

V[i][3] represents the hold time violation at ith leaf's clock pin; and

V[i][4] represents the hold time violation at ith leaf's data pin.

After the violation values are obtained, the cost functions for each leaf cell may be calculated. Another two-dimensional array represents the costs of all leaf cells, denoted as Cost[i][j], $i \subseteq \{1, \ldots, N\}$ and $j \subseteq \{1,2,3,4\}$.

Cost[i][1] represents the target in reducing the setup time violation at ith leaf's clock pin, and can be expressed as $$Cost[i][\mathbf{1}]=V[i][\mathbf{1}]-V[i][\mathbf{2}] \text{ if } V[i][\mathbf{2}]>0$$

$$Cost[i][\mathbf{1}]=V[i][\mathbf{1}] \text{ if otherwise.}$$

If Cost[i][1]>0, then either there is a setup time violation at this clock pin, or the setup time violation at the clock pin is greater than that at its data pin. The target to reduce the setup time violation is Cost[i][1]. To achieve this, it becomes necessary to make the clock signal reach this pin earlier (see Equation (1)). In other words, the delay from the root to this clock pin must be reduced. However, the delay cannot be reduced without any control because reduction of the delay to the clock pin may cause a setup time violation at the data pin (as described below).

If Cost[i][1]≦0, then either there is no setup time violation at this clock pin, or there is a larger setup time violation at the data pin than at the clock pin. Consequently, the delay from the root to this pin can be increased by a value of |Cost[i][1]| without violating the setup time target at this clock pin.

Cost[i][2] represents the target in reducing the setup time violation at ith leaf's data pin, and can be expressed as:

$$Cost[i][\mathbf{2}]=V[i][\mathbf{2}] \text{ if } V[i][\mathbf{1}]<0$$

$$Cost[i][\mathbf{2}]=V[i][\mathbf{1}]-V[i][\mathbf{2}] \text{ if otherwise.}$$

If Cost[i][2]<0, then either there is a setup time violation at the data pin or there is a larger setup time violation at the data pin than at the clock pin. Consequently, the delay from the root to this leaf's clock pin must be increased so that the setup time violation at the data pin can be reduced. However, the delay cannot be increased without any control because a delay increase may cause a setup time violation at the clock pin. The maximal acceptable delay increase is controlled by Cost[i][1]. If Cost[i][1]>0, the delay from the root to this clock pin cannot be increased. If Cost[i][1]<0, the maximal delay increase accepted is |Cost[i][1]|.

If Cost[i][2]≧0, then either there is no setup time violation at the data pin, or the setup time violation at the data pin is smaller than that at the clock pin. Consequently, the delay from the root to its clock pin can be reduced by the value of Cost[i][2] without violating the setup time target at this data pin.

Cost[i][3] represents the target in reducing the hold time violation at ith leaf's clock pin, and can be expressed as $$Cost[i][3]=V[i][3]-V[i][4] \text{ if } V[i][4]>0$$

$$Cost[i][3]=V[i][3] \text{ if otherwise.}$$

Cost[i][4] represents the target in reducing the hold time violation at ith leaf's data pin, and can be expressed as $$Cost[i][4]=V[i][4] \text{ if } V[i][3]<0$$

$$Cost[i][4]=V[i][3]-V[i][4] \text{ if otherwise.}$$

In step 210, no hold time violation will be controlled. Consequently, Cost[i][3] is assigned a value of minus infinity and Cost[i][4] is assigned a value of infinity for all clock tree leafs. In most conventions, infinity and minus infinity is achieved by assigning Cost[i][3]=−10000 and Cost[i][4]=10000. Cost[i][3]=−10000 means that there is no hold time violation at the clock pin, so even if the best case delay from the root to this clock pin is increased by 10000 ns, it would not cause a hold time violation at this clock pin. Cost[i][4]=10000 means that there is no hold time violation at the data pin, so even if the best case delay from the root to this leaf's clock pin is reduced by 10000 ns, it would not cause the hold time violation at this data pin. (Those skilled in the art will recognize that a 10000 ns delay in an IC design is effectively the same as an infinite value, which means that the delay is not important.) In other words, for step 202 the hold time is not considered when optimizing the clock tree. The only cost functions used in step 202 are Cost[i][1] and Cost[i][2], which are the setup time targets.

In step 220, the goal is to reduce the setup time violation at clock tree leafs with the constraints that the hold time violations at these leafs are not getting larger after restructuring the clock tree. Consider a simple example of a clock tree to be optimized having 3 leaves, whose cost are:

$$Cost[1]=(0.2, -0.1, -0.1, 0.2) \text{ for leaf } 1$$

$$Cost[2]=(0.2, 0.3, -0.1, 0.05) \text{ for leaf } 2$$

$$Cost[3]=(-10000, 10000, -10000, 10000) \text{ for leaf } 3$$

For leaf 1, the setup time target is 0.2 ns at its clock pin. This means that the worst case delay from the root to this clock pin must be reduced in order to reduce the setup time violation. However, this leaf also has the setup time target of −0.1 ns at its data pin, which requires an increase in the delay from the root to this leaf's clock pin. These two requirements appear contradictory, so the clock tree cannot be restructured to improve the setup time violations for this leaf.

For leaf 2, the setup time target is 0.2 ns at its clock pin, which requires a reduction in the worst case delay to this clock pin. The setup time target of 0.3 ns at its data pin means that there is no setup time violation at this data pin. It also indicates that the maximal acceptable worst case delay reduction from the root to this leaf's clock pin is 0.3 ns without violating the setup time target at this data pin. The hold time target of −0.1 ns at its clock pin means that it does not have a hold time violation and that the maximal acceptable best case delay reduction from root to this clock pin is 0.1 ns. The hold time target of 0.05 ns at its data pin means that it does not have hold time violation, and that the maximal acceptable best case delay increase, from the root to this leaf's clock pin, is 0.05 ns. Consequently, if the maximum best case delay is increased by more than 0.05 ns, a violation of the hold time target at its data pin will occur, which is not accepted.

For leaf 3, these targets mean that this leaf cell is not on any setup timing path or any hold timing path (e.g., MUX in FIG. 3). Therefore the delay can be changed in any way (reduced or increased) from the root to this leaf's clock pin.

For this simple example, the clock tree may be restructured to reduce the setup time violation for leaf 2, using the procedures set forth in the aforementioned Lu et al. application, which is incorporated herein by reference.

As an example, consider the condition that two solutions result from the restructuring process: One will reduce the worst case delay from the root to the clock pin of leaf 2 by 0.25 ns, and will also reduce the best case delay from the root to the clock pin by 0.12 ns. The other solution will reduce the worst case delay from the root to the clock pin of leaf 2 by 0.18 ns, and will also reduce the best case delay from the root to the clock pin by 0.09 ns.

The first solution gives the bigger delay reduction when compared with the second solution, which solves the whole setup time target at its clock pin (0.25>0.2). Moreover, the setup time target at the data pin allows reduction of the clock delay by up to 0.3 ns. Therefore, based on the setup time consideration, the first solution is good. However this solution also reduces the best case delay by 0.12 ns. Considering the hold time target at this clock pin, the maximal acceptable best case delay reduction is 0.1 ns, causing this solution to violate the hold time requirements. Consequently, this solution is unacceptable.

Although the second solution does not provide such a big improvement in reducing the setup time violation at the clock pin (0.18<0.2), it does meet the hold time constraints. Therefore, the second solution is the better solution.

Step 240 uses the same cost functions as used in step 220.

Step 260 uses the same cost functions as used in steps 220 and 240. However the strategy whether a restructured clock logic will be accepted or not is different. In steps 220 and 240, the restructured clock logic will be accepted if it helps reduce the setup time violations without violating the hold time targets. In step 260 the restructured clock logic is accepted if it reduces the hold time violations without violating the setup time targets. In other words, Steps 220 and 240 use the setup time targets as the costs and use the hold time targets as the constraints. Step 260 uses the setup time targets as constraints and uses the hold time targets as costs.

In preferred forms, the invention is carried out through use of a processor programmed to carry out the processes. A computer readable program code is stored in a computer readable storage medium, such as a disc drive, and contains instructions that enable the processor to carry out the steps of the processes of resynthesis of the clock and data logics to optimize setup and hold time violations. More particularly, the instructions enable the processor to resynthesize the clock logics of each pin having a setup time violation to optimize the setup time violations. The instructions then enable the processor to resynthesize the data logics of each pin having a setup time violation to optimize the setup time violations. The instructions then enable the processor to resynthesize the clock logics of each pin having a setup time violation to optimize the setup time violations. After completion of optimization of the setup time violations, the instructions enable the processor to resynthesize the data logics and then the clock logics of each pin having a hold time violation to optimize the hold time violations. The instructions also enable the processor to calculate a plurality of cost functions for each pin based on setup and hold time violations, and selectively apply the calculated cost functions to selected resynthesis steps.

Although the present invention has been described with reference to preferred embodiments, workers skilled in the art will recognize that changes may be made in form and detail without departing from the spirit and scope of the invention.

What is claimed is:

1. In a process of designing an integrated circuit, a process of optimizing setup and hold time violations comprising steps of:

a) resynthesizing data and clock logics coupled to pins of the integrated circuit to optimize setup time violations, wherein step (a) comprises steps of:

a1) resynthesizing the clock logic of each pin having a setup time violation to optimize the setup time violations;

a2) after step a1), resynthesizing the data logic of each pin having a setup time violation to optimize the setup time violations;

a3) after step a2), resynthesizing the clock logic of each pin having a setup time violation to optimize the setup time violations; and b) resynthesizing data and clock logics coupled to pins of the integrated circuit to optimize hold time violations.

2. The process of claim 1, further comprising steps of:

a4) calculating, for each pin, a plurality of cost functions based on setup and hold time violations; and a5) selectively applying calculated cost functions to steps a1) and a3).

3. The process of claim 2, wherein the cost functions are based on the setup time violations at clock pins of leaves on a clock tree of the integrated circuit, the setup time violations at data pins of the leaves, the hold time violations at the clock pins and the hold time violations at the data pins.

4. The process of claim 1, wherein step a1) comprises steps of:

a1A) resynthesizing the data logic of pins having a maximal setup time violation to optimize the maximal setup time violation;

a1B) resynthesizing the clock logic of a first group of pins to optimize the setup time violation of each pin of the first group, the first group of pins having setup time violations greater than a threshold that is below the maximal setup time violation; and a1C) resynthesizing the clock logic of a second group of pins to optimize the setup time violation of each pin of the second group, the second group of pins having setup time violations that are no greater than the threshold.

5. The process of claim 4, wherein step a1B) comprises, for each element having a clock pin and a data pin in the first group of pins:

calculating a first cost function based on a setup time violation at the clock pin;

calculating a second cost function based on a setup time violation at the data pin;

setting third and fourth cost functions based on infinite hold time violations at the clock and data pins; and resynthesizing the clock logic of the first group of pins based on the first, second, third and fourth cost functions; and wherein step a1C) comprises, for each element having a clock pin and a data pin in the second group of pins:

calculating a fifth cost function based on a setup time violation at the clock pin;

calculating a sixth cost function based on a setup time violation at the data pin;

calculating a seventh cost function based on a hold time violation at the clock pin;

calculating an eighth cost function based on a hold time violation at the data pin; and resynthesizing the clock logic of the second group of pins based on the fifth, sixth, seventh and eighth cost functions.

6. The process of claim 4, wherein step (b) comprises steps of:

b1) resynthesizing the data logic to optimize the hold time violations; and b2) resynthesizing the clock logic to optimize the hold time violations.

7. The process of claim 4, wherein step (b) comprises steps of:

b) resynthesizing the data logic to optimize the hold time violations; and b) resynthesizing the clock logic to optimize the hold time violations.

8. In a process of designing an integrated circuit, a process of optimizing setup and hold time violations comprising steps of:

a) resynthesizing data and clock logics coupled to pins of the integrated circuit to optimize setup time violations;

b) resynthesizing the data logic to optimize the hold time violations;

c) calculating, for each pin, a plurality of cost functions based on setup and hold time violations; and d) resynthesizing the clock logic using the calculated cost functions to optimize the hold time violations.

9. The process of claim 8, wherein the cost functions are based on the setup time violations at clock pins of leaves on a clock tree of the integrated circuit, the setup time violations at data pins of the leaves, the hold time violations at the clock pins and the hold time violations at the data pins.

10. The process of claim 8, wherein step c) comprises, for each element having a clock pin and a data pin:

calculating a first cost function based on a setup time violation at the clock pin;

calculating a second cost function based on a setup time violation at the data pin;

calculating a third cost function based on a hold time violation at the clock pin; and calculating a fourth cost function based on a hold time violation at the data pin; and wherein step d) comprises:

resynthesizing the clock logic based on the first, second, third and fourth cost functions.

11. A storage medium having stored therein processor executable instructions that enable a processor to change clock delays in a clock network design for an ASIC having at least one clock source, the processor executable instructions comprising:

first instructions comprising:

instructions that enable the processor to resynthesize the clock logic of each pin having a setup time violation to optimize the setup time violations;

instructions that enable the processor to respond to the optimization of setup time violations in the clock logic to resynthesize the data logic of each pin having a setup time violation to optimize the setup time violations; and instructions that enable the processor to respond to the optimization of setup time violations in the data logic to resynthesize the clock logic of each pin having a setup time violation to optimize the setup time violations; and second instructions that enable the processor to resynthesize data and clock logics coupled to pins of the integrated circuit to optimize hold time violations.

12. The storage medium of claim 11, wherein the first instructions further comprises:

instructions that enable the processor to calculate, for each pin, a plurality of cost functions based on setup and hold time violations; and instructions that enable the computer to selectively apply calculated cost functions to the resynthesis of the clock logic.

13. The storage medium of claim 11, wherein the first instructions further comprises:

instructions that enable the processor to resynthesize the data logic of pins having a maximal setup time violation to optimize the maximal setup time violation;

instructions that enable to processor to resynthesize the clock logic of a first group of pins to optimize the setup time violation of each pin of the first group, the first group of pins having setup time violations greater than a threshold that is below the maximal setup time violation; and instructions that enable the processor to resynthesize the clock logic of a second group of pins to optimize the setup time violation of each pin of the second group, the second group of pins having setup time violations that are no greater than the threshold.

14. The storage medium of claim 13, wherein the first instructions further comprises:

instructions that enable the processor to calculate a first cost function based on a setup time violation at a clock pin of an element in the first group having a clock pin and data pin in the first group of pins;

instructions that enable the processor to calculate a second cost function based on a setup time violation at the data pin of the element in the first group;

instructions that enable the processor to resynthesize the clock logic of the first group of pins based on the first and second cost functions and on cost functions based on infinite hold time violations at the clock and data pins of the element in the first group;

instructions that enable the processor to calculate a third cost function based on a setup time violation at a clock pin of an element in the second group having a clock pin and a data pin in the second group of pins;

instructions that enable the processor to calculate a fourth cost function based on a setup time violation at the data pin of the element in the second group;

instructions that enable the processor to calculate a fifth cost function based on a hold time violation at the clock pin off the element in the second group;

instructions that enable the processor to calculate a sixth cost function based on a hold time violation at the data pin of the element in the second group; and instructions that enable the processor to resynthesize the clock logic of the second group of pins based on the third, fourth, fifth and sixth cost functions.

15. The storage medium of claim 13, wherein the second instructions comprises:

instructions that enable the processor to resynthesize the data logic to optimize the hold time violations; and instructions that enable the processor to resynthesize the clock logic to optimize the hold time violations.

16. The storage medium of claim 11, wherein the second instructions comprises:

instructions that enable the processor to resynthesize the data logic to optimize the hold time violations; and instructions that enable the processor to resynthesize the clock logic to optimize the hold time violations.

17. A storage medium having stored therein processor executable instructions that enable a processor to change clock delays in a clock network design for an ASIC having at least one clock source, the processor executable instructions comprising:

first instructions that enable the processor to resynthesize data and clock logics coupled to pins of the integrated circuit to optimize setup time violations; and second instructions comprising:

instructions that enable the processor to resynthesize the data logic to optimize the hold time violation;

instructions that enable the processor to calculate, for each pin, a plurality of cost functions based on setup and hold time violations; and instructions that enable the processor to resynthesize the clock logic using the calculated cost functions to optimize the hold time violations.

18. The storage medium of claim 17, wherein the instructions that enable the processor to calculate cost functions comprises, for each element having a clock pin and a data pin:

instructions that enable the processor to calculate a first cost function based on a setup time violation at the clock pin;

instructions that enable the processor to calculate a second cost function based on a setup time violation at the data pin;

instructions that enable the processor to calculate a third cost function based on a hold time violation at the clock pin; and instructions that enable the processor to calculate a fourth cost function based on a hold time violation at the data pin; and the instructions that enable the processor to resynthesize the clock logic comprises:

instructions that enable the processor to resynthesize the clock logic based on the first, second, third and fourth cost functions.

* * * * *